(12) United States Patent
Okushima

(10) Patent No.: US 7,352,547 B2
(45) Date of Patent: Apr. 1, 2008

(54) SEMICONDUCTOR INTEGRATED CIRCUIT DEVICE

(75) Inventor: Mototsugu Okushima, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 116 days.

(21) Appl. No.: 11/432,529

(22) Filed: May 12, 2006

(65) Prior Publication Data

US 2006/0262472 A1    Nov. 23, 2006

(30) Foreign Application Priority Data

May 18, 2005    (JP) .............................. 2005-145068

(51) Int. Cl.
*H02H 9/00*    (2006.01)
(52) U.S. Cl. ........................................................ 361/56
(58) Field of Classification Search .................. 361/56, 361/111, 91.1, 42
See application file for complete search history.

(56) References Cited

U.S. PATENT DOCUMENTS 5,426,323 A * 6/1995 Reczek et al. .............. 257/360
5,646,434 A * 7/1997 Chrysostomides et al. .. 257/355
5,679,971 A * 10/1997 Tamba et al. ................ 257/357
6,075,686 A * 6/2000 Ker .............................. 361/56
2002/0084490 A1* 7/2002 Ker et al. .................... 257/355

FOREIGN PATENT DOCUMENTS

JP    9-172146    6/1997

\* cited by examiner

*Primary Examiner*—Michael Sherry
*Assistant Examiner*—Christopher J Clark
(74) *Attorney, Agent, or Firm*—McGinn IP Law Group, PLLC

(57) ABSTRACT

A semiconductor integrated circuit device of the invention includes: a first power supply system including a first circuit connected with a first power supply line; a second power supply system including a second circuit connected with a second power supply line; a signal line connected between the first circuit and the second circuit, and transmitting a signal between the first circuit and the second circuit; a discharge path which is different from the signal line and through which an abnormal current flows when an abnormal voltage is applied between the first power supply system and the second power supply system; a detecting circuit for detecting a potential difference between two positions in the discharge path through which the abnormal current flows when the abnormal voltage is generated; and a protective circuit that operates based on an output of the detecting circuit to suppress a voltage increase of the signal line.

14 Claims, 17 Drawing Sheets

*RELATED ART*

*RELATED ART*

SEMICONDUCTOR INTEGRATED CIRCUIT DEVICE

BACKGROUND OF THE INVENTION

1. Field of the Invention

The present invention relates to a semiconductor integrated circuit device. In particular, the invention relates to a semiconductor integrated circuit device regarding a protective circuit for protecting an element against an abnormal voltage generated in plural power supply systems.

2. Description of Related Art

In recent years, miniaturization and speed-up of a semiconductor integrated circuit have been under way. Along with this, voltage reduction is required of the semiconductor integrated circuit. In parallel therewith, a power supply line is laid out using plural power supply systems for a circuit that is relatively weak against noise in many cases.

For example, in the case where a semiconductor device includes an analog circuit and a digital circuit, the analog circuit is relatively sensitive to a potential change, so the analog circuit and the digital circuit are connected with different power supply systems in many cases.

For the semiconductor integrated circuit including such plural power systems, a protective circuit for protecting a circuit element against breakdown due to a surge voltage, electrostatic electricity, or other such abnormal voltage has been developed. FIG. 20 shows a semiconductor integrated circuit where a protective circuit is provided in plural power supply systems. A power supply line on a low-potential side 903 of a power supply voltage of an analog unit 901 connected with a signal line 909 is connected with a power supply line on a low-potential side 905 of a power supply voltage of a digital unit 902 through a protective circuit 910 as a switching circuit to thereby avoid the breakdown due to the abnormal voltage (see Japanese Unexamined Patent Application Publication No. 9-172146, for example).

In this circuit, if a potential difference between the power supply line on the low-potential side 903 of a power supply voltage of the analog unit 901 and the power supply line on the low-potential side 905 of the power supply voltage of the digital unit 902 exceeds a predetermined level, current flows through the protective circuit 910 to thereby discharge an abnormal current resulting from an abnormal voltage.

Hence, it is possible to avoid such a situation that a potential of the signal line 909 increases along with an increase in potential of the power supply line, and a gate potential of a MOS transistor composing an input circuit 908 is excessively increased to break a gate of the MOS transistor.

However, according to this method, the signal line 909 is protected through a snap-back operation of a MOS parasitic bipolar transistor, so there is a problem in that if the MOS transistor of the input circuit 908 is made up of an ultra-thin film, a gate oxide film is more likely to break before the start of the snap-back operation.

The present inventor has recognized that a clamping voltage for snapback of a transistor ($V_{clamp}$) and a breakdown voltage of the gate dielectrics ($V_{BD}$) are converging in 90 nm process (FIG. 21). In 90 nm process, a region between $V_{clamp}$ and $V_{BD}$, called by design window, is narrow.

FIG. 22A shows a general scheme for power protection network and FIG. 22B shows an equivalent circuit of power protection network as shown in FIG. 22A. In a first power supply system 911 having a first circuit 912, a power supply line VDD1 on a high-potential side and a power supply line GND1 on a low-potential side are provided as the power supply lines. In a second power supply system 913 having a second circuit 914, a power supply line VDD2 on a high-potential side and a power supply line GND2 on a low-potential side are provided as the power supply lines.

A signal line 915 is connected between the first circuit 912 and the second circuit 914 to transmit signals between the first circuit 912 and the second circuit 914.

A power supply line protective circuit 916 and a power supply line protective circuit 917 do not operate in normal times but operates when electrostatic electricity, a surge voltage, or other such abnormal voltage is generated. A signal line protective circuit 918 is provided for a protection of the signal line 915.

$V_{pad}$ is a total stress voltage at a pad, as shown in FIG. 22B, and $V_{signal}$ is a stress voltage of the interface gate. The $V_{pad}$ and $V_{signal}$ are described below as an equation.

$$V_{pad} = V_1 + V_3 + I_A \cdot R_1 + I_A \cdot R_3 + I_A \cdot R_{wire} \quad (1)$$

$$V_{signal} = V_2 + (V_{pad} - V_2) \times \frac{R_2}{R_2 + R_{\_Pch\_driver}} \quad (2)$$

$R_{wire}$ is described as the representation of wiring resistance along various abnormal current paths. The purpose of the signal line protective circuit 918 is to make the $V_{signal}$ smaller than the $V_{pad}$. If the $V_{signal}$ exceeds the $V_{BD}$, the gate oxide is broken.

For mixed-power domain protection in narrow design window, a clamping voltage of the back-to-back diodes (=$V_3$; about 1V) has a large dependence on $V_{pad}$. Therefore, the signal line protective circuit 918 is necessary for decreasing $V_{signal}$. As the gate oxide thickness of transistor gets thinner, allowed $V_{signal}$ becomes smaller and the clamping voltage of the signal line protective circuit 918 ($V_2$) becomes more influential on $V_{signal}$ in equation (2).

As described above, in the conventional protective circuit, as the semiconductor circuit becomes smaller and the design window gets smaller, if a clamp voltage after the snap-back operation of the MOS transistor reaches or exceeds a breakdown voltage of the gate oxide film, it is difficult to sufficiently protect a semiconductor device having plural power supply systems against an abnormal voltage on a signal line.

SUMMARY OF THE INVENTION

A semiconductor integrated circuit device according to an aspect of the present invention includes: a first power supply system including a first circuit connected with a first power supply line; a second power supply system including a second circuit connected with a second power supply line; a signal line connected between the first circuit and the second circuit, and transmitting a signal between the first circuit and the second circuit; a discharge path which is different from the signal line and through which an abnormal current flows when an abnormal voltage is applied between the first power supply system and the second power supply system; a detecting circuit for detecting a potential difference between two positions in the discharge path through which the abnormal current flows when the abnormal voltage is generated; and a protective circuit that operates based on an output of the detecting circuit to suppress a voltage increase of the signal line.

A semiconductor integrated circuit device according to another aspect of the invention includes: a power supply system including a circuit connected with a power supply line; a signal line for transmitting a signal between the circuit and an external circuit of the power supply system; and a discharge path which is different from the signal line and through which an abnormal current flows when an abnormal voltage is applied to the power supply system; and a protective circuit that is provided outside the discharge path and operates based on the potential difference between the two positions in the discharge path.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1:
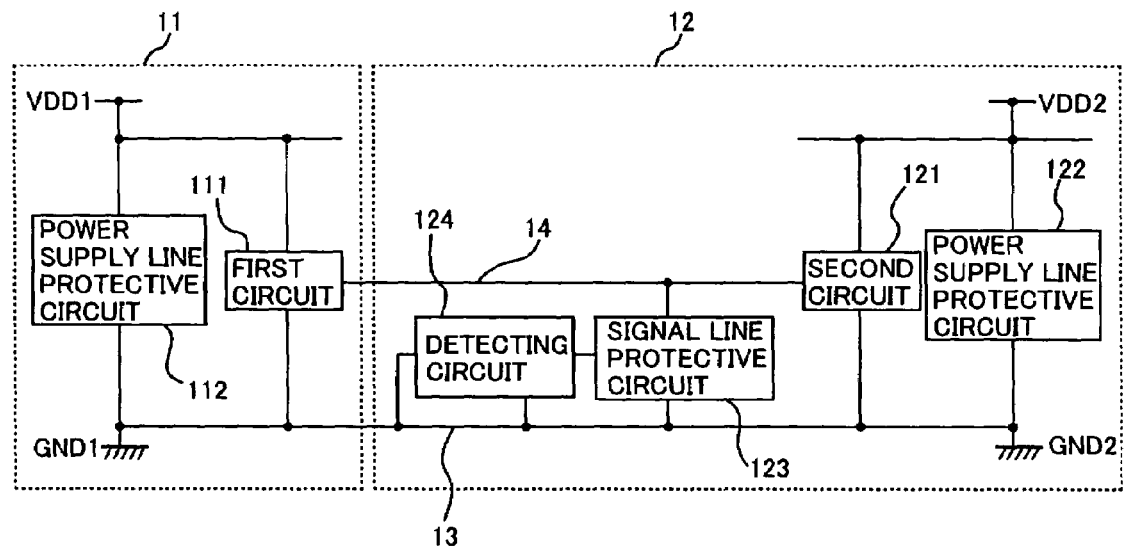
FIG. 1 is a block diagram showing a semiconductor integrated circuit according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Hereinafter, embodiments of the present invention are described. For precise description, the following description and the accompanying drawings are appropriately simplified or omitted. Incidentally, the same components are denoted by like reference numerals throughout the accompanying drawings, and for clear description, repetitive description is omitted if not necessary.

A semiconductor integrated circuit according to a first embodiment of the present invention is described below. FIG. 1 is a block diagram showing a semiconductor integrated circuit of this embodiment. In a first power supply system 11 having a first circuit 111, a power supply line VDD1 on a high-potential side and a power supply line GND1 on a low-potential side are provided as the power supply line. The first circuit 111 is connected with the power supply line VDD1 on the high-potential side and the power supply line GND1 on the low-potential side.

Further, in a second power supply system 12 having a second circuit 121, a power supply line VDD2 on the high-potential side and a power supply line GND2 on the low-potential side are provided as the power supply line. The second circuit 121 is connected with the power supply line VDD2 on the high-potential side and the power supply line GND2 on the low-potential side.

A power supply line protective circuit 112 and a power supply line protective circuit 122 does not operate in normal times but operates when electrostatic electricity, a surge voltage, or other such abnormal voltage is generated. The protective circuits are connected with a discharge path 13 to which an abnormal current is discharged.

Further, in this embodiment, the power supply line GND1 and the power supply line GND2 are connected and used as the discharge path 13 when an abnormal voltage is generated between VDD1 and VDD2. The discharge path 13 is provided in the order of VDD1→power supply line protective circuit 112→GND1→GND2→power supply line protective circuit 122→VDD2, and includes the power supply line protective circuits 112 and 122 for discharging the abnormal current due to the abnormal voltage when the abnormal voltage is generated on the power supply line.

Furthermore, a signal line 14 is connected between the first circuit 111 and the second circuit 121 to transmit signals between the first circuit 111 and the second circuit 121. When the abnormal voltage is generated, most of the current flows through the discharge path 13, but a part of the abnormal current flows into the signal line 14. As a result, the voltage of the signal line 14 increases and thus, the second circuit 121 may be broken.

To overcome this problem, in this embodiment, a signal line protective circuit 123 is connected between the signal line 14 and the discharge path 13. Further, a detecting circuit 124 is connected with the signal line protective circuit 123 to detect a potential difference between two positions of the discharge path 13 through which the abnormal current flows when the abnormal voltage is generated. The signal line protective circuit 123 operates only when a potential difference detected by the detecting circuit 124 exceeds a given threshold value.

Through the operation of the signal line protective circuit 123, a part of the abnormal current flowing into the signal line 14 is discharged to the discharge path 13. Due to this discharge, a voltage increase of the signal line 14 is suppressed. Regarding the potential difference between two positions where the detecting circuit executes measurement, two positions on the discharge path 13 are arbitrarily set such that the detecting circuit does not detect a potential difference during the normal operation, or the detecting circuit operates only when the abnormal current is generated. The signal line protective circuit 123 is not allowed to operate during the normal operation not to influence the normal operation.

Assuming here that the abnormal voltage is generated between the power supply line VDD1 on the high-potential side and GND2 in the first power supply system 11, if the abnormal voltage is generated on the power supply line VDD1 on the high-potential side of the first power supply system 11, the generated abnormal current flows into GND1 and GND2 through the power supply line protective circuit 112.

At this time, the abnormal current also flows through the first circuit 111, and then flows into the second circuit 121 through the signal line 14. If the voltage of the signal line 14 exceeds a given threshold value, the second circuit is broken.

To that end, a potential difference between two positions on the discharge path is measured. If the difference exceeds a predetermined value, the signal line protective circuit 123 connected with the signal line 14 operates. When the signal line protective circuit 123 operates, the abnormal current flowing through the signal line 14 is passed through the discharge path 13 by way of the signal line protective circuit 123 to prevent the voltage of the signal line 14 from reaching a marginal breakdown voltage that breaks the second circuit.

Further, in this embodiment, it is possible to change the degree at which the voltage of the signal line 14 is reduced based on a ratio between impedance of the power supply line VDD1 on the high-potential side to the signal line 14 in the first circuit 111 and impedance of the signal line protective circuit 123. Thus, the impedance of the signal line protective circuit 123 is reduced, by which a voltage increase of the signal line 14 can be further suppressed, and a level of the abnormal voltage that causes the second circuit 121 to reach the marginal breakdown voltage can be raised.

Further, a MOS transistor capable of serving as the signal line protective circuit 123 and the detecting circuit 124 may be used. This is because the use of the MOS transistor serving as the signal line protective circuit 123 and the detecting circuit 124 can reduce a space for the signal line protective circuit 123 and the detecting circuit 124, which contributes to space-saving.

Figure 2:
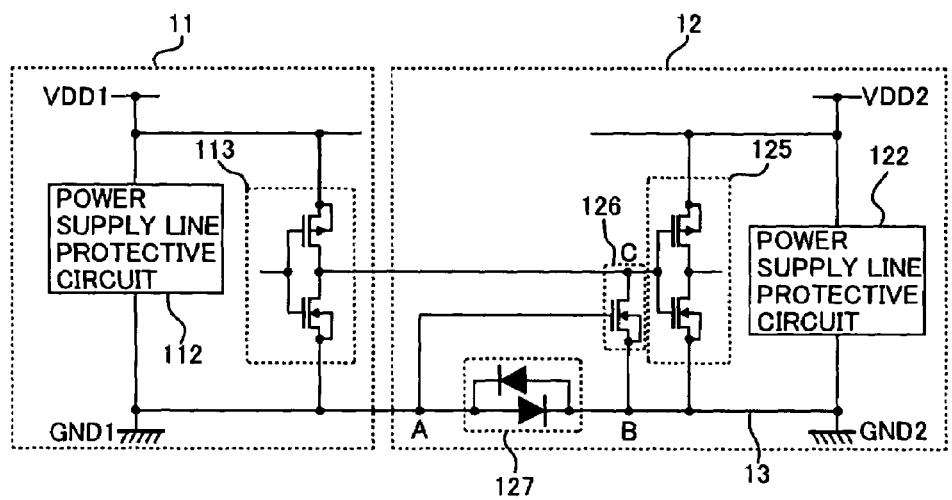
FIG. 2 shows a first example of the semiconductor integrated circuit of the first embodiment using a potential difference across a diode on a discharge path.

FIG. 2 shows an example of this embodiment. In this example, an output circuit 113 is used as the first circuit 111, and an input circuit 125 is used as the second circuit 121. Further, as the signal line protective circuit 123, the MOS transistor 126 is provided. Further, a bipolar diode 127 is provided as a discharging unit on the discharge path 13.

The term discharging unit used herein means a unit that discharges an abnormal current when the abnormal voltage is generated but does not operate in normal times. The discharging unit is provided on the discharge path 13. Further, a potential difference across the bipolar diode 127 provided on the discharge path 13 is detected to clearly determine whether or not the abnormal current flows.

The MOS transistor 126 is connected with both ends of the bipolar diode 127. A gate of the MOS transistor is connected with one end of the bipolar diode 127, a source thereof is connected with the other end of the bipolar diode 127, and a drain thereof is connected with the signal line 14. Hence, the MOS transistor 126 is allowed to operate if a voltage difference across the bipolar diode 127 reaches a predetermined value or larger.

When the abnormal voltage is applied to VDD1, the discharge path 13 passes the abnormal current through VDD1→GND1→GND2. At this time, a potential difference occurs across the bipolar diode 127 to let the MOS transistor 126 operate. If a gate-source potential difference of the MOS transistor 126 exceeds a threshold voltage level (=$V_2$=0.3V in eq. (2)), the abnormal current flows from a drain to a source, and the current flowing into the signal line 14 through the input circuit 125 is fed into the discharge path 13 through the MOS transistor 126. In this case, the MOS transistor 126 works as not only the detecting circuits 124 but also the signal line protective circuit 123.

Figure 3:
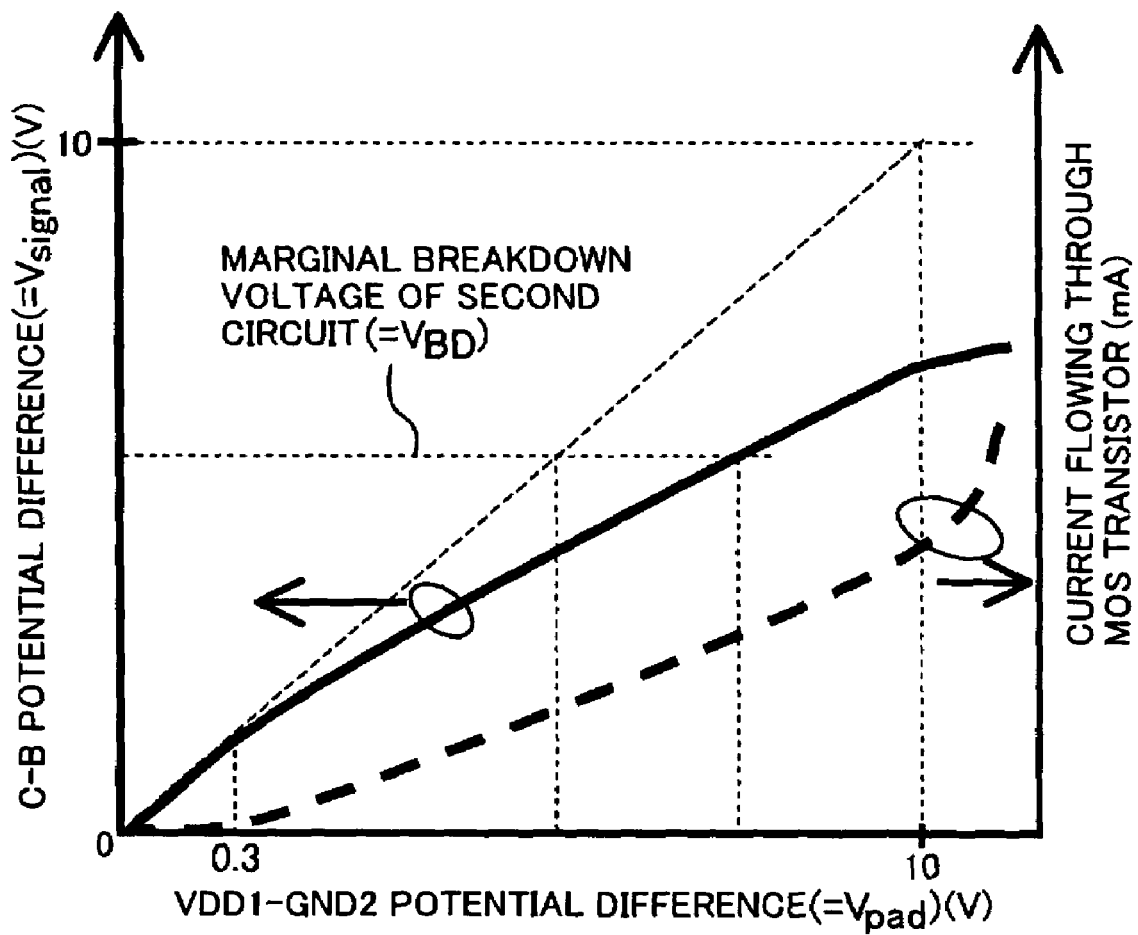
FIG. 3 shows a relation between a VDD1–GND2 potential difference and a B–C potential difference or a current flowing through the MOS transistor in the first example of the semiconductor integrated circuit of the first embodiment using a potential difference across a diode on a discharge path.
Figure 21:
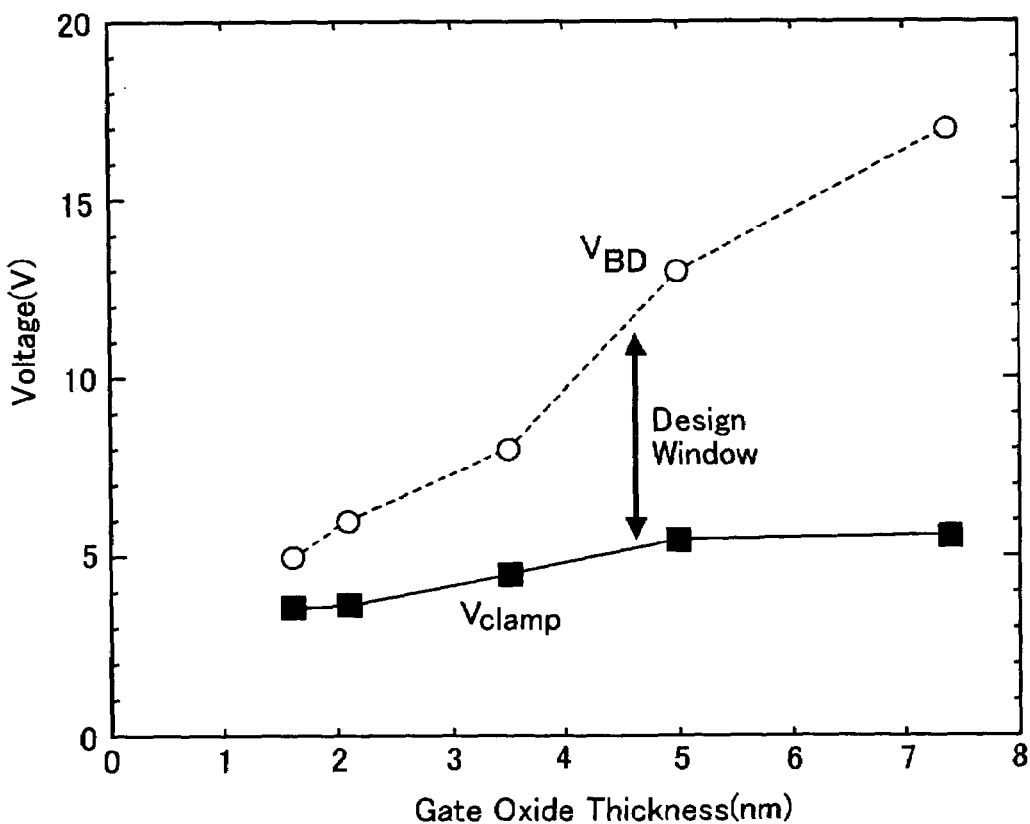
FIG. 21 shows a relationship between a gate oxide thickness and VDD1–GND2 potential difference or break-down voltage of the gate in the conventional semiconductor integrated circuit as shown in FIG. 20.
Figure 22A:
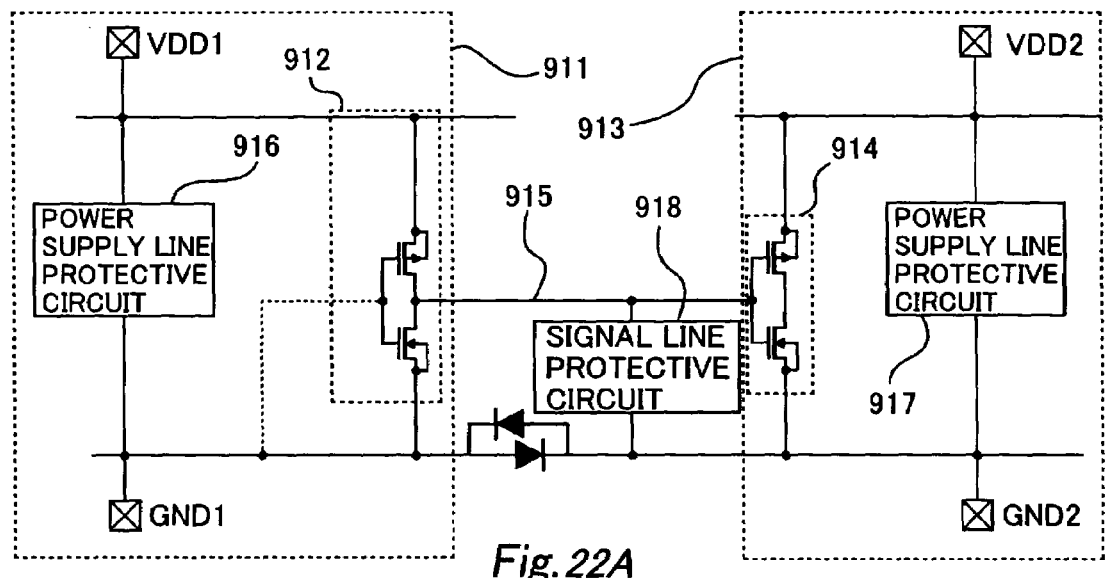
FIG. 22A is a block diagram showing a conventional semiconductor integrated circuit with signal line protective circuit and FIG. 22B is an equivalent circuit of the conventional semiconductor integrated circuit as shown in FIG. 22A.
Figure 22B:
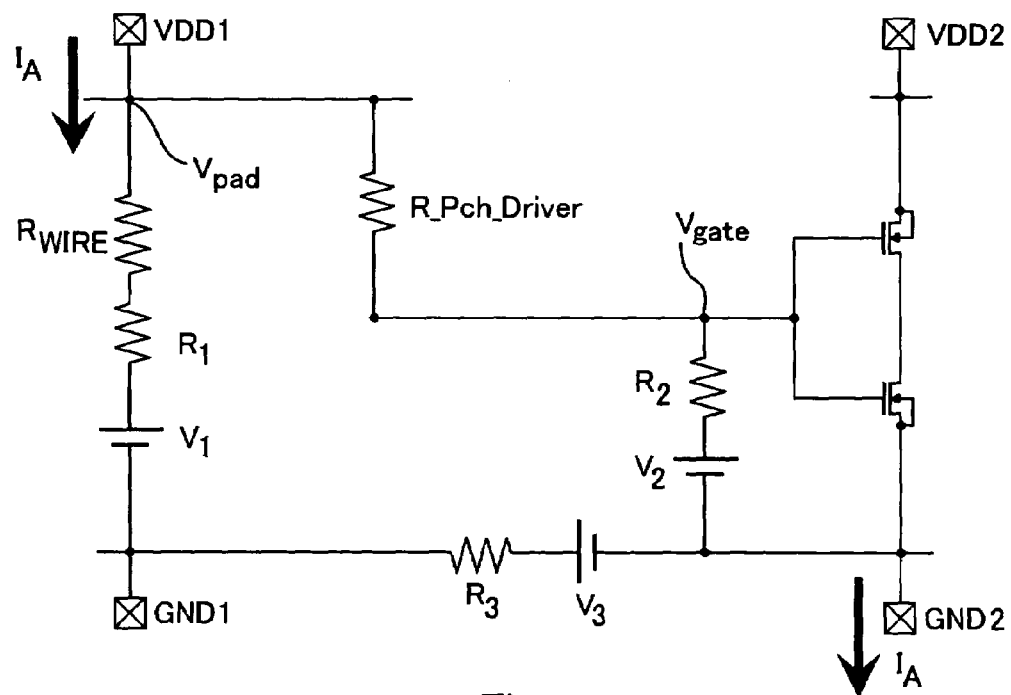

In FIG. 3, a relation between the VDD1–GND2 potential difference and the C–B potential difference of the semiconductor integrated circuit of FIG. 3 is demonstrated by the solid line, and a relation between the VDD1–GND2 potential difference and the current flowing through the MOS transistor 126 is demonstrated by the broken line. In FIG. 3, the horizontal line is VDD1–GND2 potential difference, showing $V_{pad}$ in eq. (1) and the perpendicular line is C–B potential difference, showing $V_{signal}$ in eq. (2). The marginal breakdown voltage of second circuit in FIG. 3 corresponds to $V_{BD}$ in FIG. 21. Here, B represents a node connected with the MOS transistor 126 and the discharge path 13, and C represents a node connected with the MOS transistor 126 and the signal line 14.

Figure 4A:
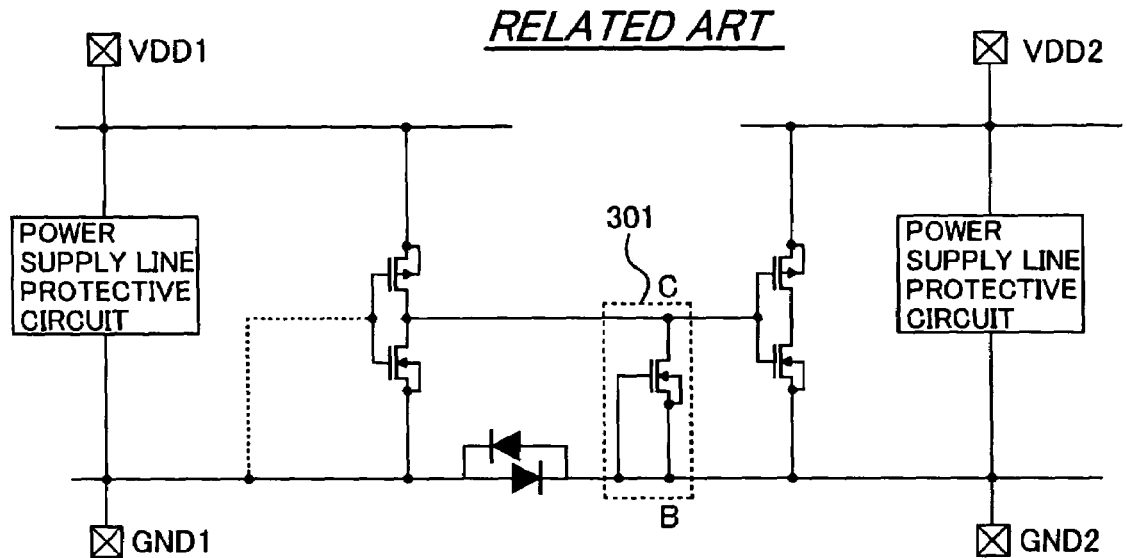
FIG. 4A shows a conventional example of the semiconductor integrated circuit for comparison purpose and FIG. 4B shows a relation between a VDD1–GND2 potential difference and a B–C potential difference or a current flowing through the MOS transistor in the conventional example of the semiconductor integrated circuit as shown in FIG. 4A.
Figure 4B:
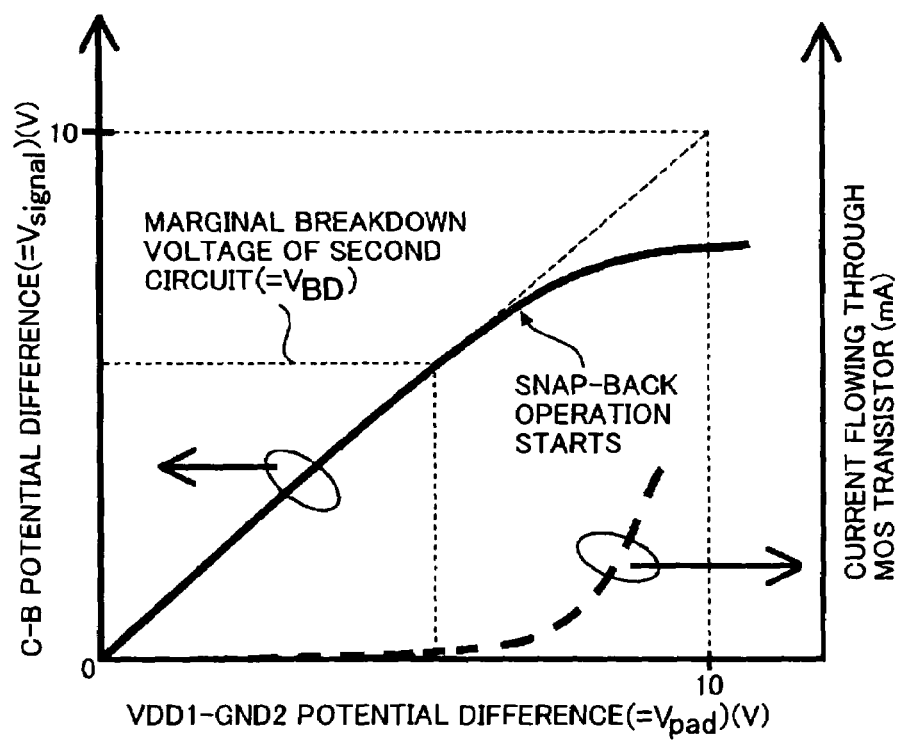

For comparison purposes, FIG. 4A shows an example of a semiconductor integrated circuit with a conventional protective circuit. In the conventional semiconductor integrated circuit as shown in FIG. 4A, a MOS transistor is used as the signal line protective circuit 301. FIG. 4B shows a relation between the VDD1–GND2 potential difference and the C–B potential difference which is indicated by the solid line and between the VDD1–GND2 potential difference and the current flowing through the MOS transistor 126 which is indicated by the broken line in the case of using a conventional protective circuit as shown in FIG. 4A. The solid line indicates a relation between the VDD1–GND2 potential difference and the C–B potential difference, and the broken line represents a relation between the VDD1–GND2 potential difference and the current flowing through a protective transistor of the Related Art as shown in FIG. 4A. In FIG. 4B, the horizontal line is VDD1–GND2 potential difference, showing $V_{pad}$ in eq. (1) and the perpendicular line is C–B potential difference, showing $V_{signal}$ in eq. (2). The marginal breakdown voltage of second circuit in FIG. 4B corresponds to $V_{BD}$ in FIG. 21.

The VDD1–GND2 potential difference corresponds to the abnormal voltage, and the C–B potential difference corresponds to a voltage that breaks the second circuit 121. The protective circuit is determined as satisfactory as long as the C–B potential difference can be suppressed down to the breakdown voltage or smaller even if a larger VDD1–GND2 potential difference (=voltage) is applied.

With the conventional protective circuit, the signal line is protected through the snap-back operation of the parasitic bipolar transistor as the MOS transistor. In general, a clamp voltage after the snap-back operation of the MOS transistor is as high as about 5 V, so a lower voltage cannot be clamped with a small potential difference smaller than 5 V. That is, the VDD1–GND2 potential difference of up to 5 V is equal to the C–B potential difference. Thus, if the marginal breakdown voltage of the second circuit is 5 V or lower, the second circuit is broken before the protective circuit operates. If the potential difference that causes the snap-back operation is higher than the marginal breakdown voltage of the second circuit, the second circuit is broken before the protective circuit operates.

In contrast, in this embodiment, if the gate-source voltage (=detection voltage) of the MOS transistor 126 reaches a threshold voltage or higher at low voltage, the MOS transistor 126 operates and the C–B potential difference can be suppressed at low voltage. Thus, if the VDD1–GND2 potential difference is 5 V or smaller and the threshold of the MOS transistor is lower voltage than 5V, the C–B potential difference can be suppressed at lower voltage than 5V. That is, the level of the VDD1–GND2 voltage at which the C–B potential difference reaches the marginal breakdown voltage of the second circuit 121 can be raised as compared with the conventional example. Thus, the semiconductor integrated circuit of this embodiment is configured so as to withstand a high level of abnormal voltage. In other words, $V_2$ in eq. (2) is about 0.3V in this embodiment, smaller than 5V in the conventional case and so signal line protective circuit in this embodiment suppresses an increase of $V_{signal}$.

Figure 5A:
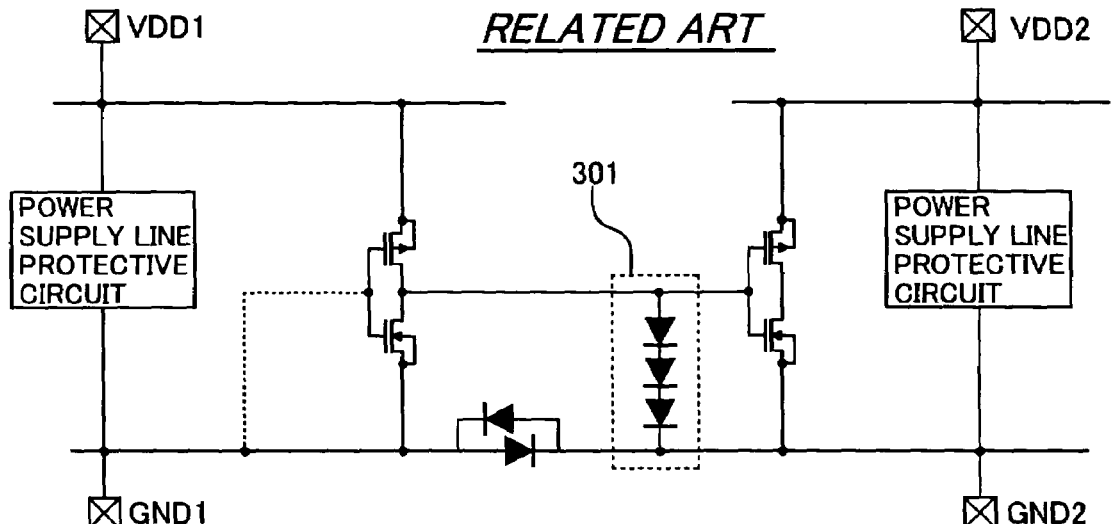
FIG. 5A shows another conventional example of the semiconductor integrated circuit for comparison purpose using diode strings and FIG. 5B shows a MM performance and an area of a line signal protective circuit in the first example of the semiconductor integrated circuit of the first embodiment using a potential difference across a diode on a discharge path and two conventional semiconductor integrated circuits as shown in FIGS. 4A and 5A.
Figure 5B:
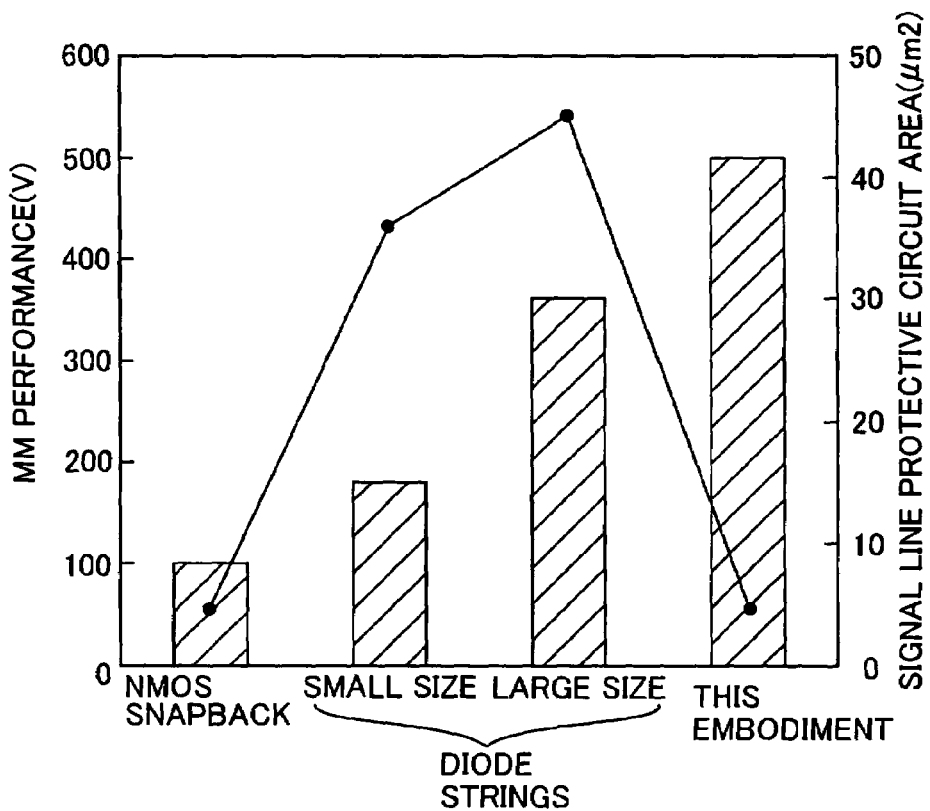

For comparison purposes, FIG. 5A shows another example of a conventional semiconductor integrated circuit with diode strings. In the conventional semiconductor integrated circuit as shown in FIG. 5A, diode strings are used as the signal line protective circuit 301. FIG. 5B shows a MM (Machine Model) performance, an estimation of CMOS process in 90 nm process, and an area of the signal line protective circuit in two conventional semiconductor integrated circuits with a protective circuit, a snap-back type as shown in FIG. 4A and a diode strings type as shown in FIG. 5A and this embodiment as shown in FIG. 2. The diode strings type has two types as a small diode type and a large diode type, comparing with the semiconductor integrated circuit with the signal line protective circuit in this embodiment. $V_2$ in the diode strings type is about 2V, three times of $V_f$. This embodiment has about five times higher MM performance with same area as the snap-back type. The MM performance shows a withstand for the abnormal voltage, so this embodiment has about five times higher withstand for the abnormal voltage than the snap-back type. The diode type shows smaller MM performance with larger area than this embodiment. Thus, keeping $V_2$ small is suppressing the increase of $V_{signal}$ and the semiconductor integrated circuit with a protective circuit of this embodiment is effective for protection of thin gate oxides.

Figure 6:
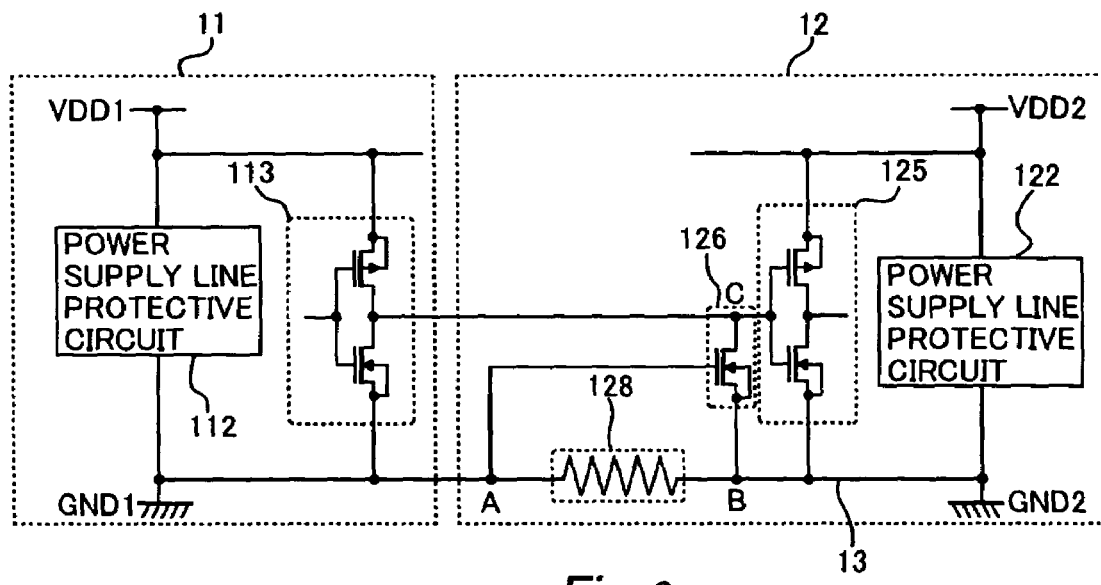
FIG. 6 shows a second example of the semiconductor integrated circuit of the first embodiment using a potential difference across a resistor on a discharge path.

As another example of this embodiment, a resistor 128 replaces the bipolar diode 127 in the discharge path 13 as the discharging unit. FIG. 6 shows an example where the MOS transistor is connected with both ends of the resistor 128. The resistor 12 may be a parasitic resistor such as a wiring resistor or via resistor or may be additionally provided as a resistive element for improving detection sensitivity.

In this example, when an abnormal voltage is applied to VDD1, an abnormal current flows through the resistor 128, with the result that a potential difference across the resistor 128 occurs. Due to the potential difference, the MOS transistor 126 starts operating, and the abnormal current can be passed to the discharge path 13 from the signal line 14 through the MOS transistor 126. This makes it possible to prevent the second circuit 121 from breaking.

Figure 7A:
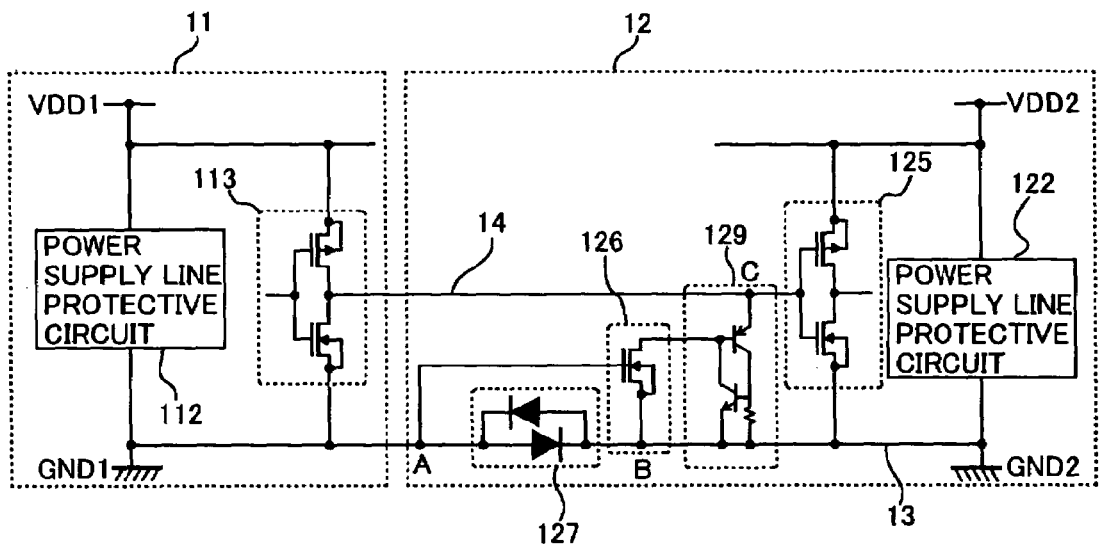
FIGS. 7A and 7B show a third example of the semiconductor integrated circuit of the first embodiment using a thyristor.

Further, as still another example of this embodiment, a thyristor (SCR) 129 may be used as the signal line protective circuit 123 (see FIG. 7A). In this case, the MOS transistor 126 functions to detect a potential difference across the bipolar diode 127 in the discharge path 13. A gate of the MOS transistor 126 is connected with one end of the bipolar diode 127, a source thereof is connected with the other end of the bipolar diode 127, and a drain thereof is connected with the SCR 129.

In this example, the operation of the SCR 129 is triggered by the MOS transistor 126. When the abnormal voltage is applied to VDD1, a potential difference occurs across the bipolar diode 127, and the MOS transistor 126 starts operating.

Thus, a current flows through the MOS transistor 126, and along with this, a current flows through the thyristor 129 as well. Further, since the impedance of the SCR 129 is much lower than that of the MOS transistor 126, a voltage applied to the signal line 14 at the time of applying the abnormal voltage to VDD1 can be considerably reduced. In this case, MOS transistor 126 works as not only the detecting circuits 124 but also the signal line protective circuit 123.

In addition, the SCR 129 allows a larger amount of current than that of the MOS transistor 126 to flow therethrough, and the clamp voltage after the operation is as low as about 1 V, so the SCR 129 can function as the too strong signal line protective circuit 123.

Figure 7B:
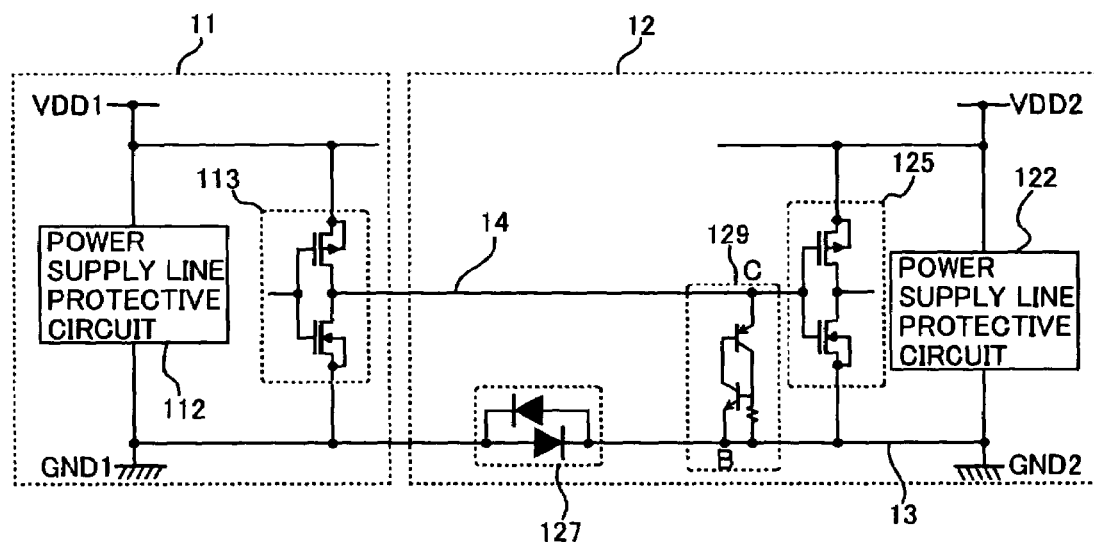
Figure 8A:
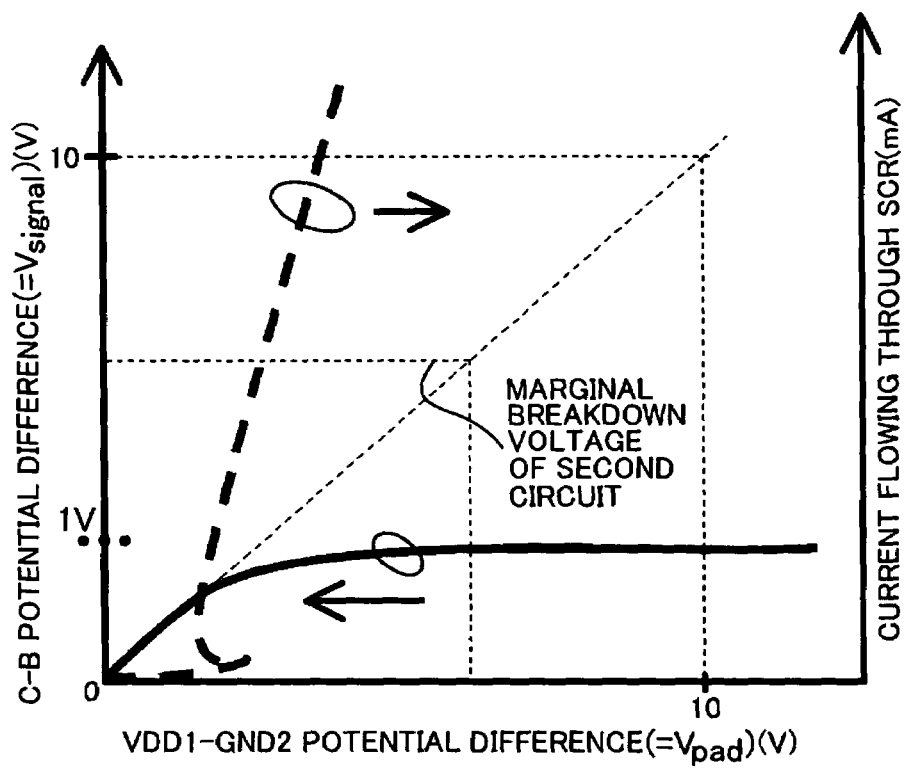
FIGS. 8A and 8B show a relation between a VDD1–GND2 potential difference and a B–C potential difference or a current flowing through the MOS transistor in the third example of the semiconductor integrated circuit of the first embodiment using the thyristor.
Figure 8B:
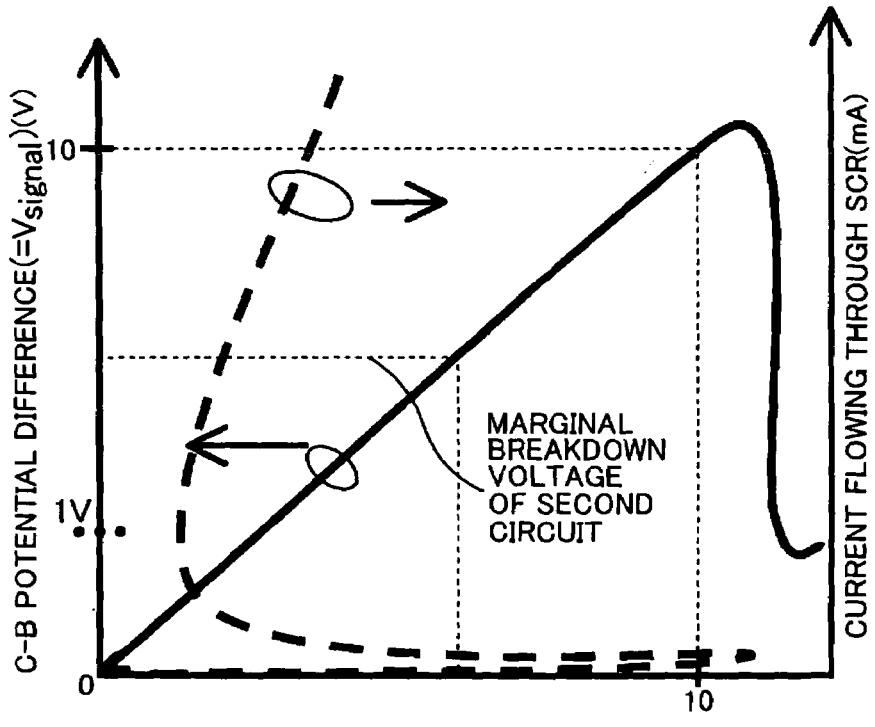

FIG. 8A shows a relation between the VDD1–GND2 potential difference and the B–C potential difference or SCR operating current in the case of providing the MOS transistor 126 that triggers the operation of the SCR 129 used as the signal line protective circuit 123 as shown in FIG. 7A. In contrast, FIG. 8B shows a relation between the VDD1–GND2 potential difference and the C–B potential difference or SCR operating current in the case of providing no MOS transistor 126 that triggers the operation of the SCR 129 as shown in FIG. 7B. In FIGS. 8A and 8B, the horizontal line is VDD1–GND2 potential difference, showing $V_{pad}$ in eq. (1) and the perpendicular line is C–B potential difference, showing $V_{signal}$ in eq. (2). The marginal breakdown voltage of second circuit in FIGS. 8A and 8B corresponds to $V_{BD}$ in FIG. 21.

When an abnormal voltage is applied to the VDD1, in the case where the MOS transistor 126 is provided, a potential difference across the bipolar diode 127 occurs to make the MOS transistor 126 operate. A current also flows into the SCR 129 by the MOS transistor 126 staring operation, and an abnormal current can flow from the signal line 14 to the discharge path 13. A large amount of current can flow through the SCR 129, so even if a VDD1–GND2 potential difference increases, and the voltage of the signal line 14 (=C–B potential difference) does not reach the marginal breakdown voltage of the second circuit 121.

In contrast, in the illustrated example of FIG. 8B, the MOS transistor 126 as a trigger is omitted, so the snap-back operation start voltage of the SCR 129 is 10 V or higher, and current is not allowed to flow through the SCR 129 until the VDD1–GND2 potential difference (=C–B potential difference) reaches 10 V. Thus, the SCR 129 does not operate as the signal line protective circuit 123, and the voltage of the signal line 14 reaches a marginal breakdown voltage of the second circuit 121.

Based on the above, the use of the semiconductor integrated circuit provided with both of the SCR 129 and the MOS transistor 126 enables the semiconductor integrated circuit having a higher protective function.

Figure 9:
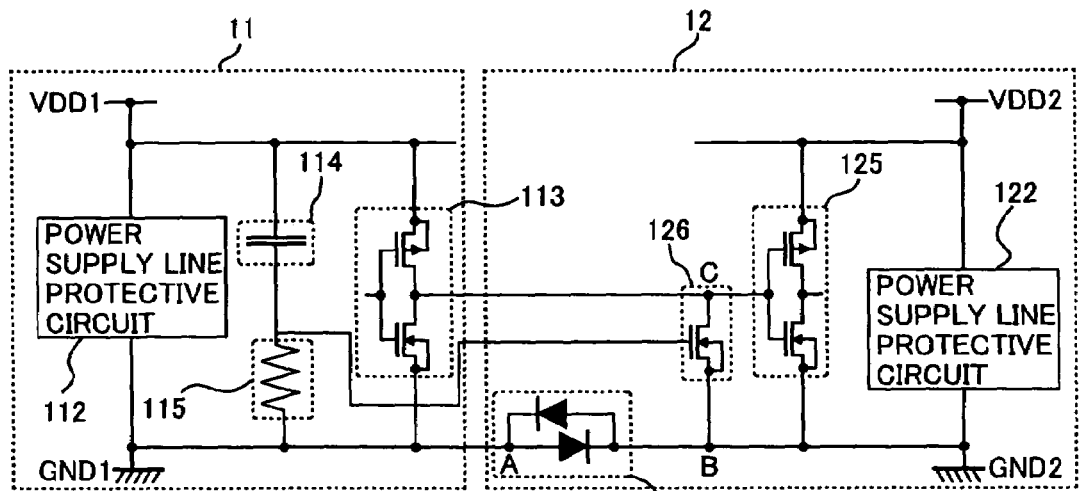
FIG. 9 shows a fourth example of the semiconductor integrated circuit of the first embodiment.

Further, two positions between which the abnormal current flows when the abnormal voltage is generated are set to both ends of the bipolar diode 127 or the resistor 128 in the semiconductor integrated circuit but may be set to any two positions in the discharge path 13. Herein, the discharge path 13 means a discharge path passing through only protective elements. FIG. 9 shows an example thereof.

In this example, a capacitor 114 and a resistor 115 parallel-connected with the power supply line protective circuit 112 are provided between VDD1 and GND1. A point D between the capacitor 114 and the resistor 115 and one point of the power supply line GND2 on the low-potential side of the second circuit 121 are connected with the MOS transistor 126.

In this case, when the abnormal voltage is applied to VDD1, most of the abnormal current flows through the power supply line protective circuit 112, and a small amount of displacement current flows through the capacitor 114 and the resistor 115 and then flows into the power supply line GND2 on the low-potential side of the second power supply system 12 through the bipolar diode 127. Therefore, when the abnormal voltage is generated, the MOS transistor 126 as the signal line protective circuit 123 starts operating, and the abnormal current flowing into the signal line 14 can be released to the discharge path 13.

Figure 10:
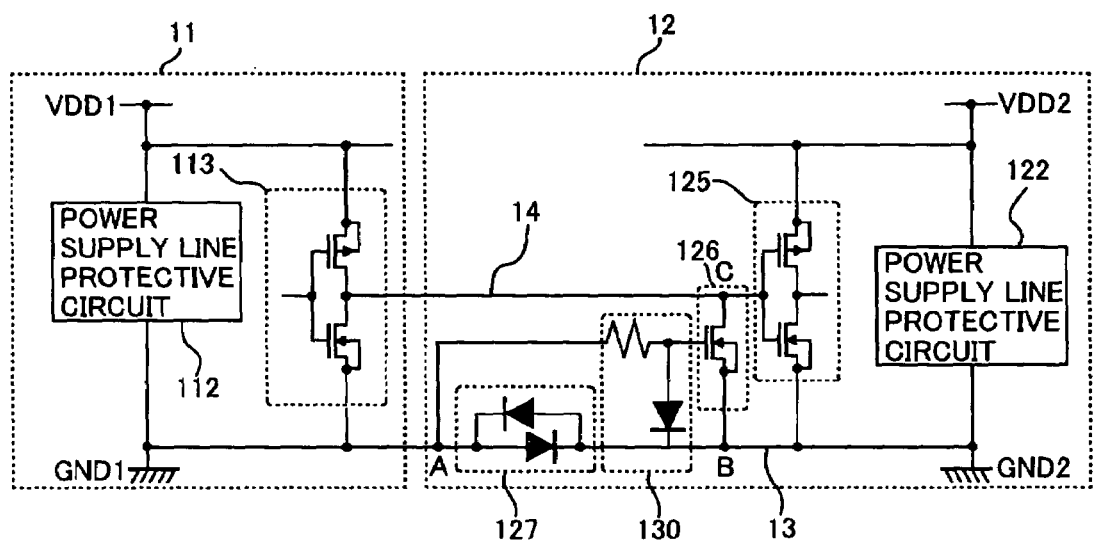
FIG. 10 shows a fifth example of the semiconductor integrated circuit of the first embodiment using a second protective circuit for protecting a protective circuit.

Further, in the semiconductor integrated circuit, a gate portion of the MOS transistor 126 as the signal line protective circuit 123 may be connected with a second protective circuit 130 (see FIG. 10). The second protective circuit is configured such that a resistor is provided on a conductor connected with the discharge path 13 and the gate of the MOS transistor 126, and a diode is provided on a conductor connecting between the conductor and the discharge path 13.

With this arrangement, if there is a possibility that a potential difference between two positions in the discharge path through which the abnormal current flows upon the generation of the abnormal voltage is higher than the breakdown voltage of the signal line protective circuit 123, the signal line protective circuit 123 can be prevented from breaking by using the second protective circuit 130.

Figure 11A:
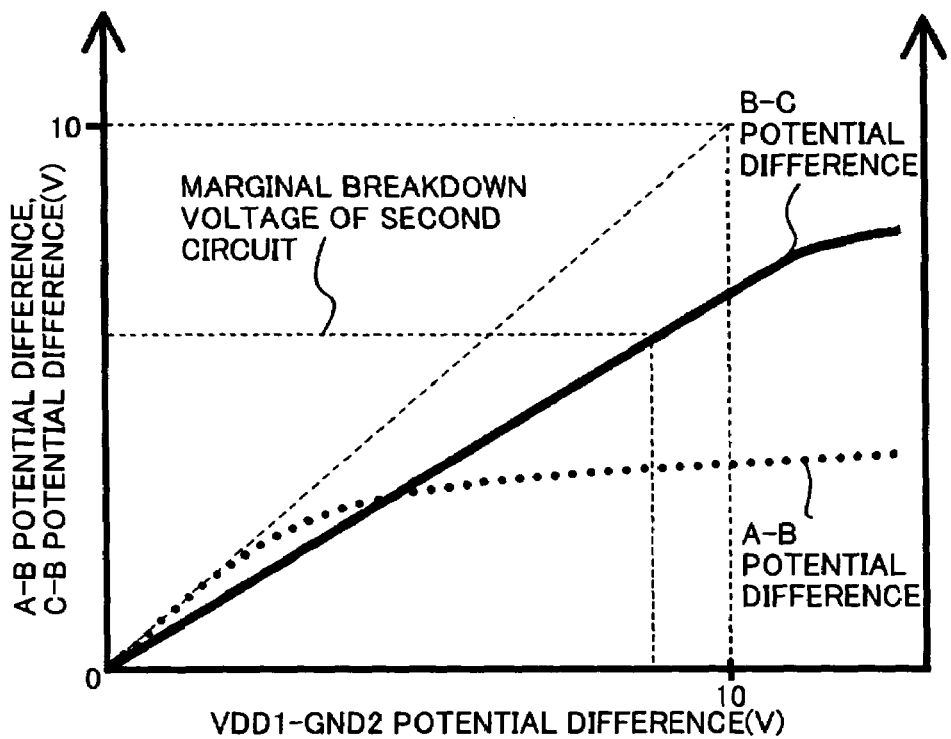
FIGS. 11A and 11B show a relation between a VDD1–GND2 potential difference and an A–B potential difference or a B–C potential difference in the fifth example of the semiconductor integrated circuit of the first embodiment using the second protective circuit for protecting a protective circuit.
Figure 11B:
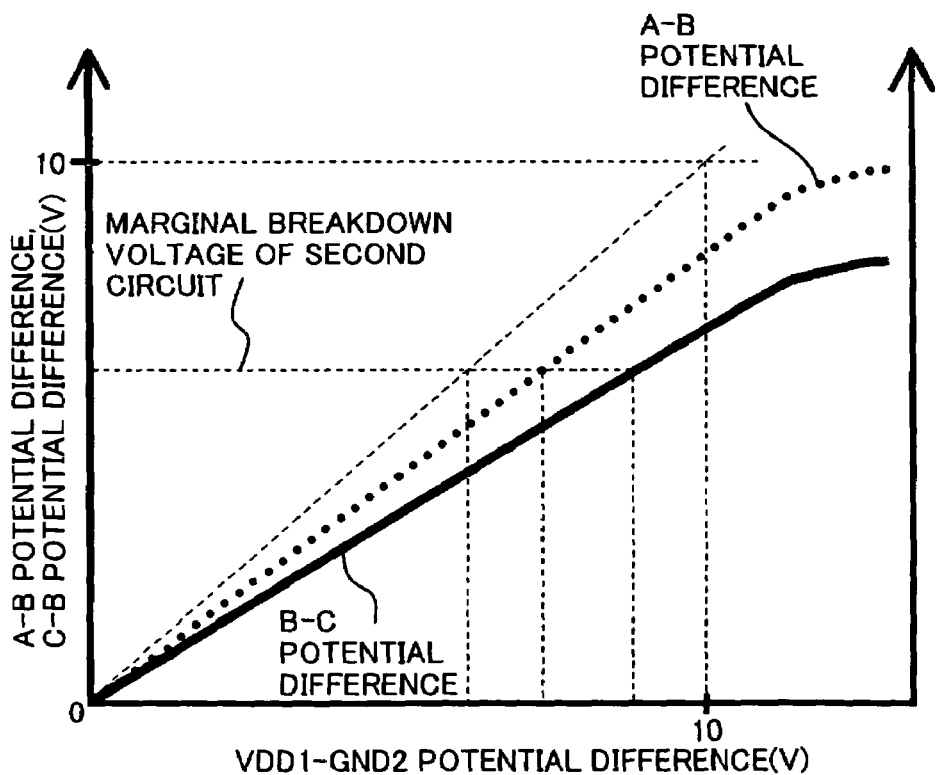

FIG. 11A shows a relation between the VDD1–GND2 potential difference and the A–B potential difference or the C–B potential difference in the case where the second protective circuit 130 is provided, and FIG. 11B shows a relation between the VDD1–GND2 potential difference and the A–B potential difference or the C–B potential difference in the case where no second protective circuit 130 is provided. In this case, the marginal breakdown voltage of the second circuit is assumed to be equal to that of the signal line protective circuit 123.

In the case where no second protective circuit 130 is provided, as the VDD1–GND2 potential difference increases, both of the A–B potential difference and the C–B potential difference increase. As a result, there is a possibility that before the C–B potential difference reaches the marginal breakdown voltage of the second circuit 121, the A–B potential difference reaches the marginal breakdown voltage of the MOS transistor 126. At this time, the protective circuit 123 is broken, so a function of protecting the signal line 14 is lost, and the VDD1–GND2 voltage that an LSI itself substantially withstands is lowered.

In contrast, in the case where the second protective circuit 130 is provided, if the VDD1–GND2 potential difference is large, the second protective circuit 130 operates to set the A–B potential difference constant. Thus, if the VDD1–GND2 potential difference increases, the A–B potential difference can be suppressed, and the MOS transistor 126 as the signal line protective circuit 123 is not broken. Thus, the signal line protective circuit 123 functions to prevent the second circuit 121 from breaking due to a voltage increase of the signal line 14 to thereby raise a level of the VDD1–GND2 voltage that causes the second circuit 121 to reach the marginal breakdown voltage.

Figure 12:
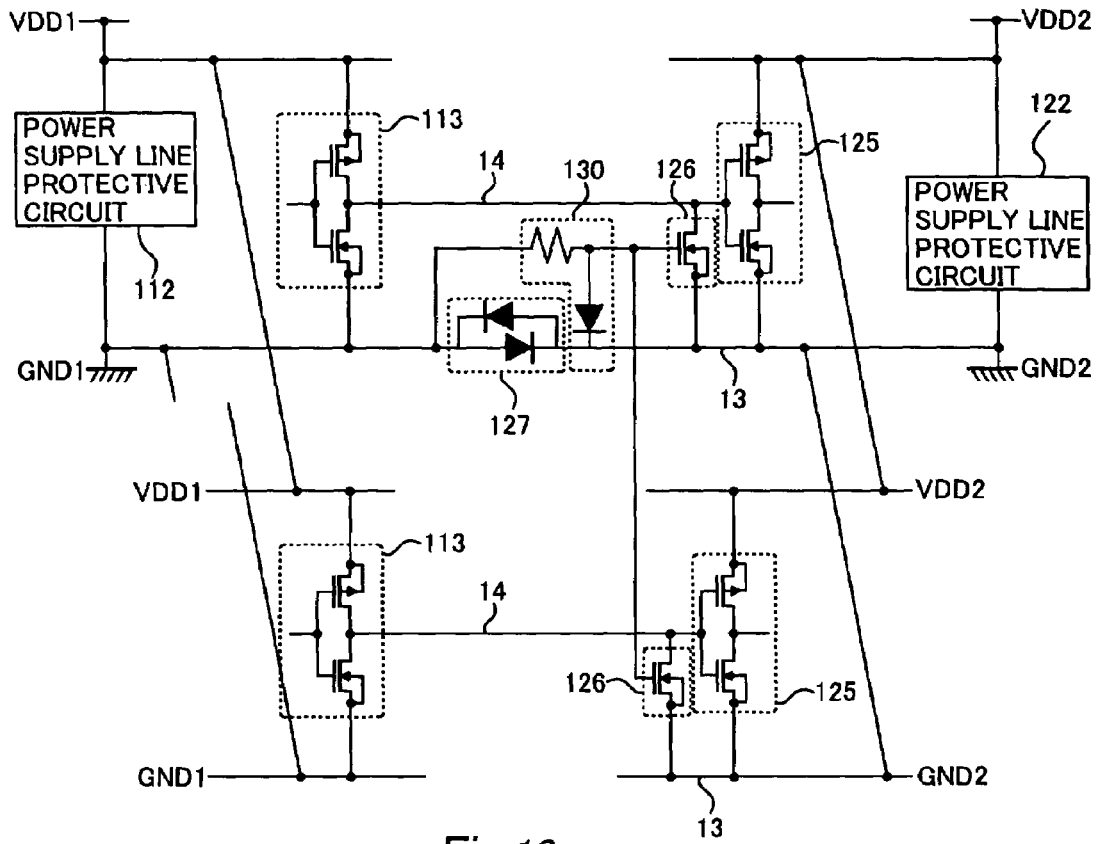
FIG. 12 shows a sixth example of the semiconductor integrated circuit of the first embodiment in parallel-connected circuits.

Further, when the plural output circuits 113 and the plural input circuits 125 corresponding thereto are parallel-connected and plural signals are exchanged, a single set of the points that the potential difference is detected and a single second signal line protective circuit 123 is enough to protect circuits. (see FIG. 12).

As described above, the signal line protective circuit 123 including the detecting circuit is operated due to the potential difference between two positions on the discharge path 13, making it possible to suppress a voltage increase of the signal line 14. Further, impedance of the signal line protective circuit 123 during the protective operation is controlled, by which the voltage of the signal line 14 can be changed upon the generation of the abnormal voltage, and a level of the abnormal voltage that reaches the marginal breakdown voltage of the second circuit 121 can be controlled.

Figure 13:
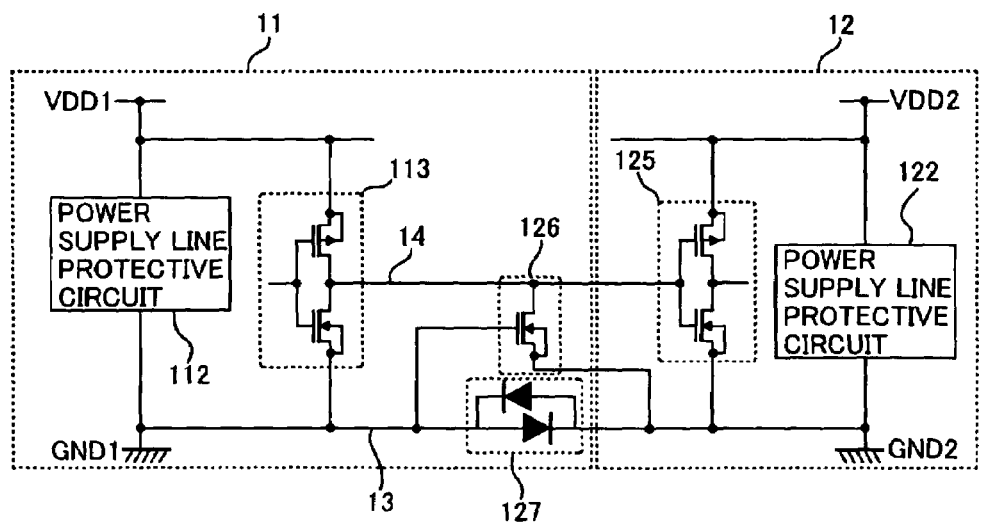
FIG. 13 shows the sixth example of the semiconductor integrated circuit of the first embodiment where a signal line protective circuit is laid in a first power supply system.

In the above embodiment, the signal line protective circuit 123 is positioned in the second circuit 121, but as shown in FIG. 13, the signal line protective circuit 123 may be provided on the first circuit 111 side. Further, in the above example, the discharge path 13 of the semiconductor integrated circuit is connected with the first power supply line on the low-potential side and the second power supply line on the low-potential side but may be connected with the first power supply line on the high-potential side and the second power supply line on the high-potential side.

Second Embodiment

Figure 14:
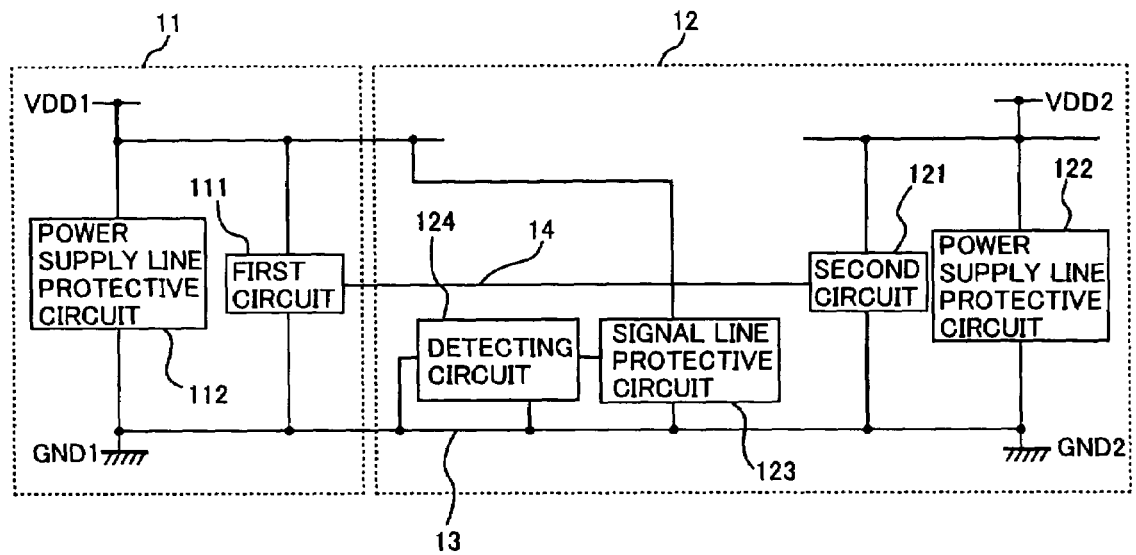
FIG. 14 is a block diagram showing a semiconductor integrated circuit according to a second embodiment of the present invention.

In a semiconductor integrated circuit according to a second embodiment of the present invention, the signal line protective circuit 123 is connected with the first power supply line on the high-potential side VDD1. FIG. 14 is a block diagram of a semiconductor integrated circuit. In FIG. 14, description about the same components or operation principle as the first embodiment is omitted.

In this embodiment, the signal line protective circuit 123 is connected with the first power supply line on the high-potential side VDD1, so when the abnormal voltage is generated, the abnormal current can directly flow from VDD1. That is, the discharge path 13 passing through only the protective circuits increases. Thus, the abnormal current hardly flows through the signal line 14, making it possible to prevent the second circuit 121 from breaking.

Figure 15:
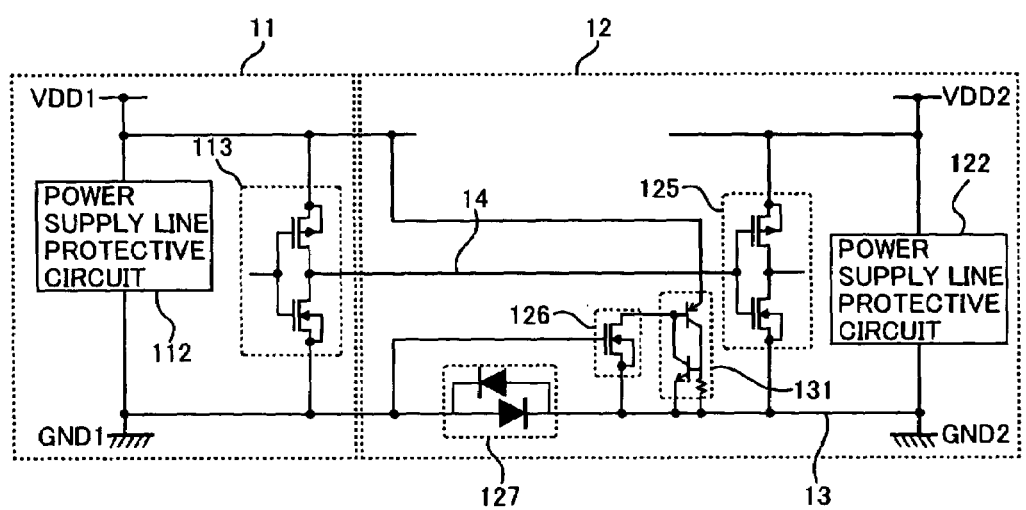
FIG. 15 shows a first example of the semiconductor integrated circuit of the second embodiment.

As an example of this embodiment, FIG. 15 shows a semiconductor integrated circuit where the SCR 129 replaces the signal line protective circuit 123, and the MOS transistor 126 functioning to trigger the operation of the SCR 129 is connected with two positions in the discharge path 13 through which the abnormal current flows when the abnormal voltage is generated.

In this example, the abnormal current flows to thereby cause a potential difference across the bipolar diode 127 and let the MOS transistor 126 start operation. This allows current to flow in the SCR 129 as well, and the abnormal current can directly flow from the first power supply line VDD1 on the high-potential side. Based on the above, a voltage applied to the signal line 14 is suppressed. In this case, a cross clamp is made by by-pass current path with SCR 129. This cross clamp decreases the potential, corresponding to $V_3+I_4 \times R_3$ in eq. (1).

Figure 16A:
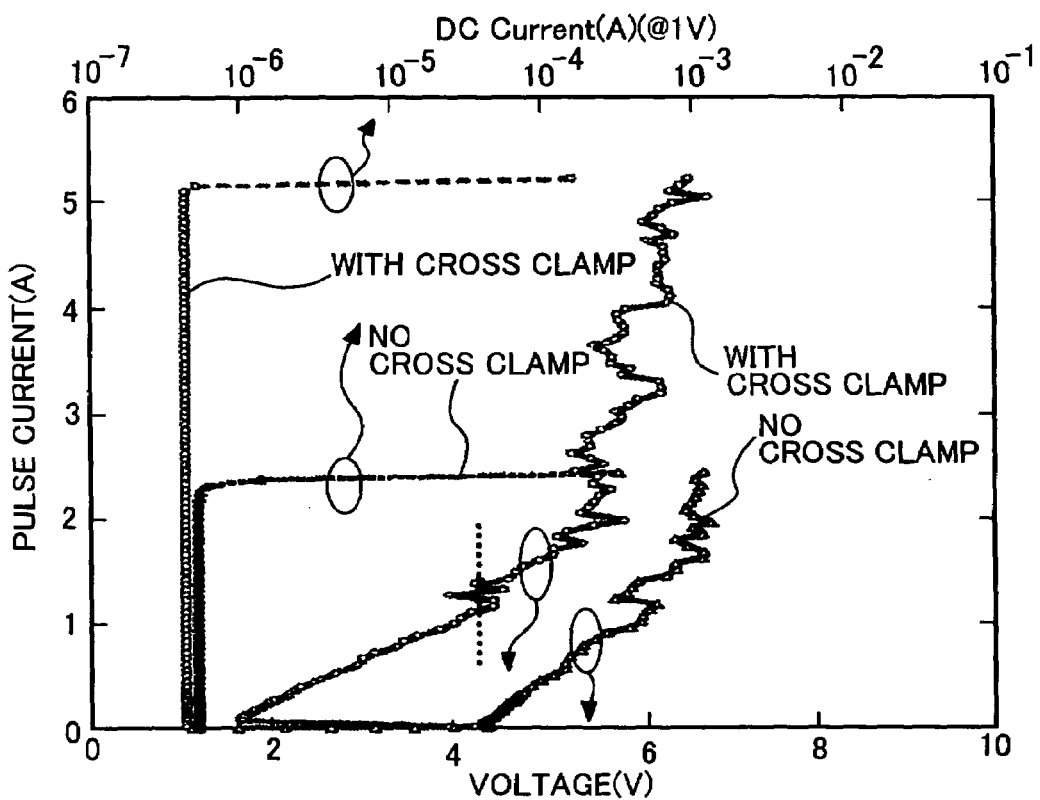
FIG. 16A shows a relationship between an induced pulse current and a VDD1–GND2 potential difference or a leak current in applying 1V voltage in the semiconductor integrated circuit with a GND current trigger type cross clamp of the second embodiment as shown in FIG. 15 and a semiconductor integrated circuit with no cross clamp and FIG. 16B is an enlarged view of trigger point in FIG. 16A.
Figure 16B:
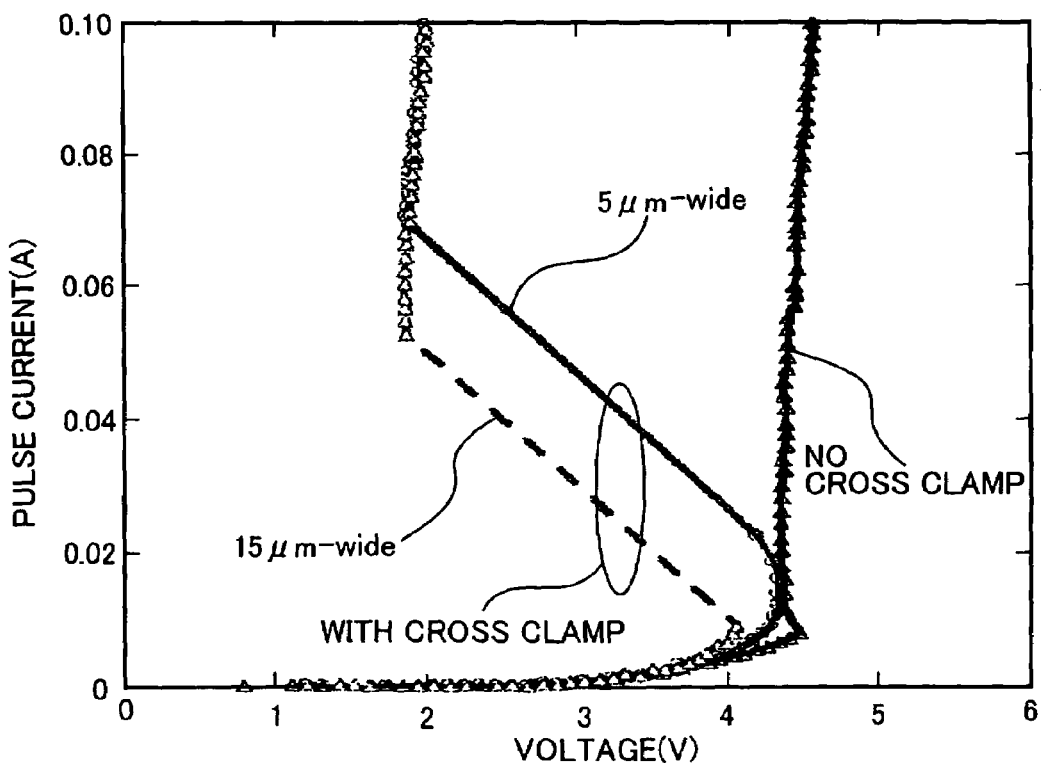

FIG. 16A shows a result in TLP measurement of the example of the semiconductor integrated circuit with SCR cross clamp and the conventional semiconductor integrated circuit with no cross clamp. In TLP measurement, a characteristic of the signal line protective circuit by measuring VDD1–GND2 potential difference in applying a pulse current and after the pulse current applying a leak current of the signal line protective circuit are detected. A dramatic increase of the leak current indicates that the input circuit 125 is broken. FIG. 16B shows an enlarged view of trigger point of FIG. 16A.

In the example of the semiconductor integrated circuit with no cross clamp, when 2.2 A pulse current is applied to the VDD1 power supply, the voltage of VDD1 terminal is about 6.5V and DC leak current in applying 1V voltage after the pulse current applying is dramatically increased. Therefore, the break-down pulse current is 2.2 A in the semiconductor integrated circuit with no cross clamp.

On the contrary, in the example of this embodiment of the semiconductor integrated circuit with SCR cross clamp, as shown in FIG. 15, when 5 A pulse current is applied to the VDD1 power supply, the voltage of VDD1 terminal is about 6.5V. However DC current in applying 1V voltage after the pulse current applying is not changed so dramatically, thus this semiconductor integrated circuit is not broken and the break-down pulse current is above 5V. In FIG. 16A, a dotted line crossing with the line of TLP characteristic in the example of this embodiment is described. This dotted line is a crossover between only SCR cross clamp works as the signal line protective circuit and both the SCR cross clamp and the power supply line protective circuit work.

In FIG. 16B, the enlarged view of trigger point is shown. FIG. 16B shows the case of 5 um-wide and 15 um-wide transistor in the semiconductor integrated circuit with SCR cross clamp. The MOS transistor 126, the detecting circuits, triggers the SCR 129 by detecting the abnormal current and flows a current to the SCR 129. When this current from the MOS transistor 126 flows to the SCR 129, the SCR 129 begins to work and flow a current by a potential of the SCR cross clamp (=1.8V). The 15 um-wide transistor has higher current flowing ability, so the 15 um-wide transistor can work quicker than the 5 un-wide transistor.

Figure 17:
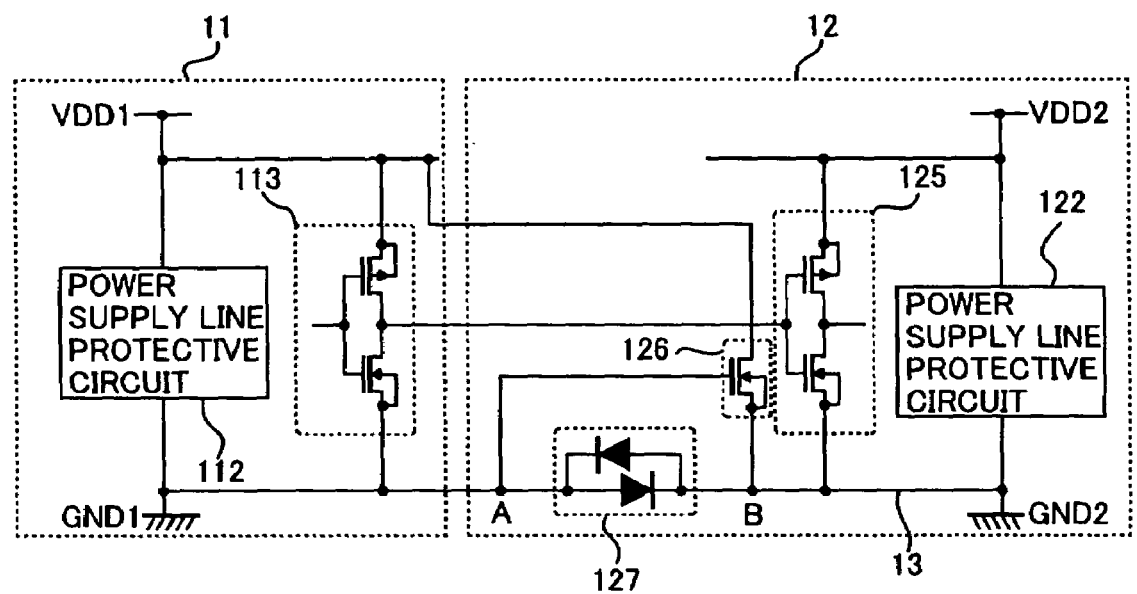
FIG. 17 shows a second example of the semiconductor integrated circuit of the second embodiment.

FIG. 17 shows a semiconductor integrated circuit where the MOS transistor 126 as the detecting circuit operates as the protective circuit as well as the detecting circuit, and a drain of the MOS transistor 126 is connected with the first power supply line VDD1 on the high-potential side. In this case as well, the abnormal current flows to thereby cause a potential difference across the bipolar diode 127 and let the MOS transistor 126 start operation. Thus, the abnormal current can directly flow from the first power supply line VDD1 on the high-potential side. Based on the above, a voltage applied to the signal line 14 is suppressed.

As described above, the signal line protective circuit 123 is connected with the first power supply line on the high-potential side VDD1 to thereby obtain a high-withstand-voltage semiconductor integrated circuit.

Third Embodiment

Figure 18A:
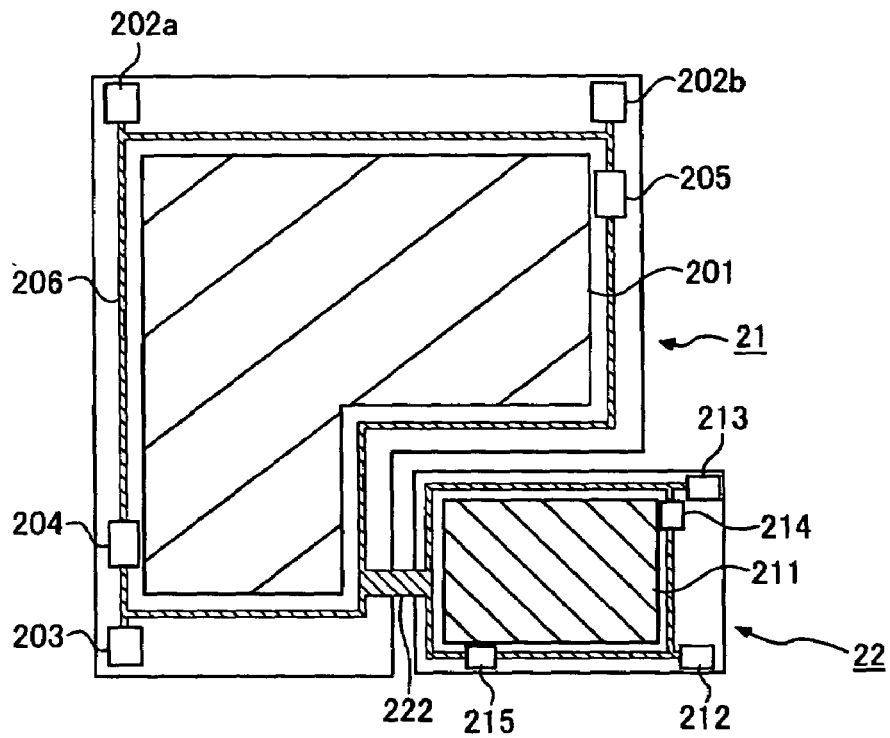
FIGS. 18A and 18B are top views of a semiconductor integrated circuit according to a third embodiment of the present invention.
Figure 18B:
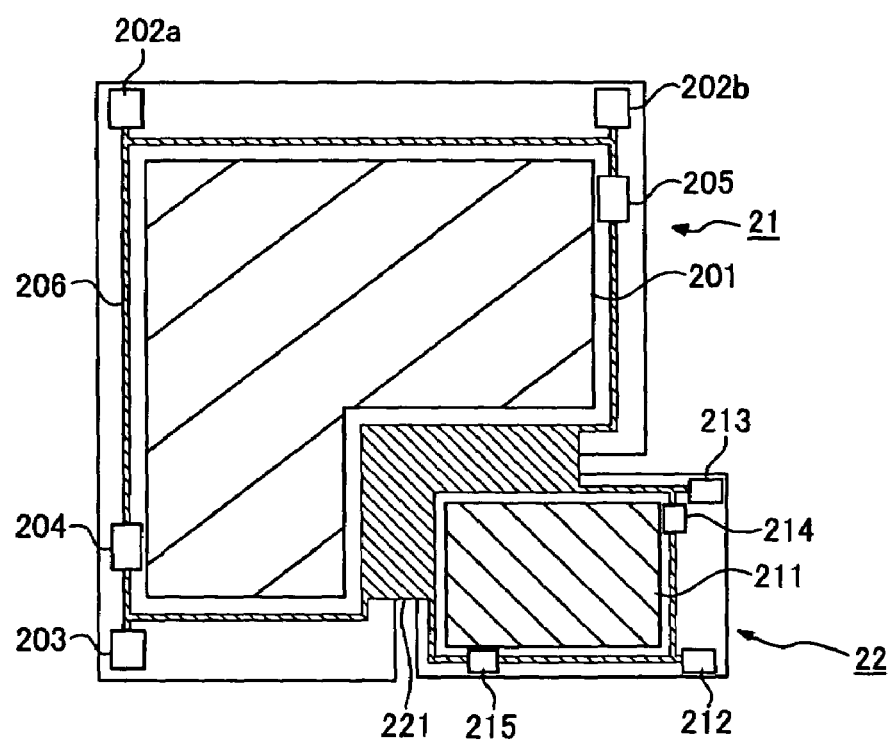

A semiconductor integrated circuit according to a third embodiment of the present invention limits a discharge path that connects between a first power supply system 21 and a second power supply system 22. FIG. 18A is a top view of the semiconductor integrated circuit of this embodiment. For comparison purposes, a top view of FIG. 18B shows a conventional semiconductor integrated circuit having plural power supply systems. In FIGS. 18A and 18B, description about the same components and operation principle as the first embodiment is omitted.

In FIGS. 18A and 18B, the first power supply system 21 including a first circuit 201 has a discharge path 206 provided around the first circuit 201. The discharge path 206 is provided with pads 202a and 202b on a high-potential side of the first power supply system 21, and connected with a pad 203 on the low-potential side of the first power supply system 21 through power supply line protective circuits 204 and 205.

Further, in the second power supply system 22 having the second circuit 211, the discharge path 206 is provided around the second circuit 211. The discharge path 206 connects a pad 212 on a high-potential side of the second power supply system and a pad 213 on a low-potential side of the second power supply system through power supply line protective circuits 214 and 215.

In the conventional semiconductor integrated circuit including plural power supply systems, a discharge path 221 between a first power supply system 21 and a second power supply system 22 is provided in an area where the first power supply system 21 is adjacent to the second power supply system 22 for ensuring the wide discharge path 206. However, in this embodiment, a discharge path 222 between the first power supply system 21 and the second power supply system 22 is limited to a discharge path shorter than a portion where the discharge path of the first power supply system 21 opposes the discharge path of the second power supply system 22.

This is because, a potential difference can be accurately detected by the signal line protective circuit 123 provided in the discharge path 222 between the first power supply system 21 and the second power supply system 22 by limiting the discharge path 206.

With the above arrangement, it is possible to provide a semiconductor integrated circuit capable of accurately detecting the abnormal current when the abnormal voltage is generated.

Fourth Embodiment

Figure 19A:
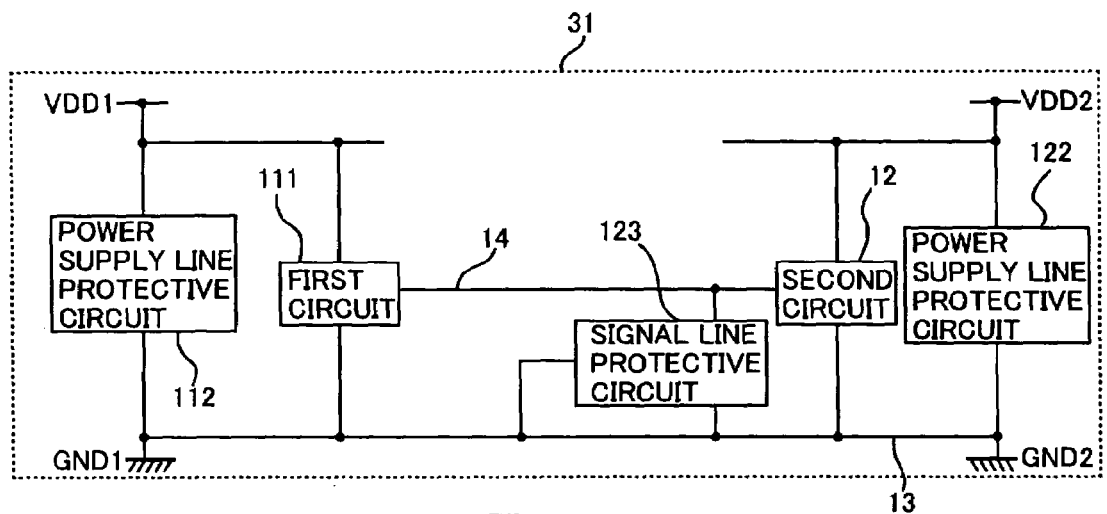
FIGS. 19A and 19B are diagrams showing an SIP type semiconductor integrated circuit and an SOC type semiconductor integrated circuit.
Figure 19B:
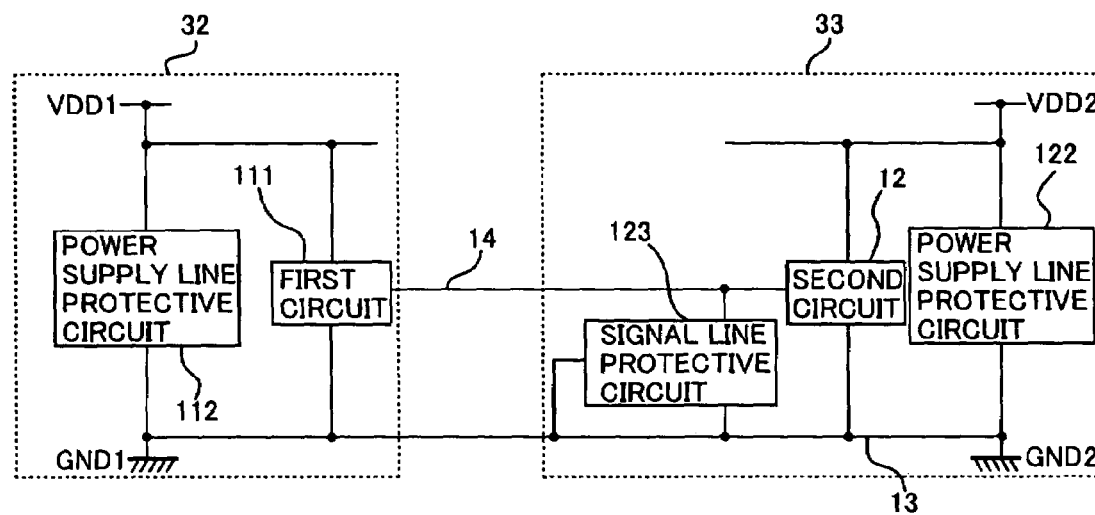
Figure 20:
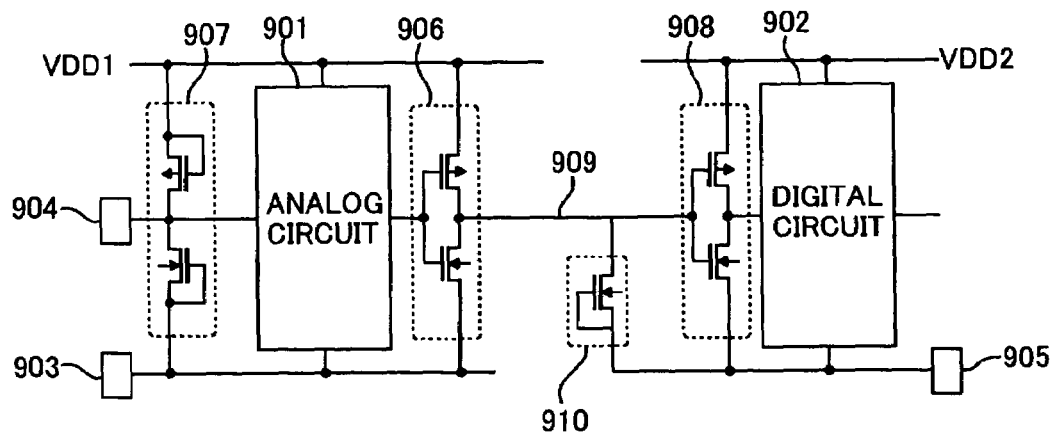
FIG. 20 is a diagram showing a conventional semiconductor integrated circuit including plural power supply systems provided with a protective circuit.

In the first, second, and third embodiments, all of the power supply systems are mounted to a single chip 31 (SOC: System On a chip). A fourth embodiment of the present invention is directed to a package including plural chips 31 where each power supply system is mounted (SIP: System in a package). FIGS. 19A and 19B are diagrams of an SOC type (FIG. 19A) and an SIP type (FIG. 19B).

In the case of the SOC type, the first power supply system including the first circuit 111 and the power supply line protective circuit 112, and the second power supply system including the second circuit 121, the power supply line protective circuit 122, and the signal line protective circuit 123, and the signal line 14 are mounted onto a single chip 31.

In the case of the SIP type, there are a first chip 32 mounted with the first power supply system including the first circuit 111 and the power supply line protective circuit 112, and a second chip 33 mounted with the second power supply system including the second circuit 121, the power supply line protective circuit 122, and the signal line protective circuit 123. The first chip 32 and the second chip 33 are connected through the signal line 14. Further, the GND1 in the first chip 32 is connected with the GND2 in the second chip 33 as the discharge path 13. Incidentally, the signal line protective circuit 123 may be provided to the first chip 32.

In the case of the SIP type, for example, if the first chip 32 is a competitor's product and it is unclear if a protective circuit for protecting a signal line is provided, it is possible to suppress a voltage increase of the signal line 14 upon generation of the abnormal voltage by providing the second chip 33 with the signal line protective circuit 123.

It is apparent that the present invention is not limited to the above embodiment that may be modified and changed without departing from the scope and spirit of the invention.

What is claimed is:

1. A semiconductor integrated circuit device, comprising:
   a first power supply system including a first circuit connected with a first power supply line;
   a second power supply system including a second circuit connected with a second power supply line;
   a signal line connected between the first circuit and the second circuit, and transmitting a signal between the first circuit and the second circuit;
   a discharge path which is different from the signal line and through which an abnormal current flows when an abnormal voltage is applied between the first power supply system and the second power supply system;
   a detecting circuit for detecting a potential difference between two positions in the discharge path through which the abnormal current flows when the abnormal voltage is generated; and
   a protective circuit that operates based on an output of the detecting circuit to suppress a voltage increase of the signal line.

2. The semiconductor integrated circuit device according to claim 1, wherein the two positions are set to sandwich a discharging unit of the discharge path.

3. The semiconductor integrated circuit device according to claim 1, wherein the detecting circuit is a MOS transistor connected with the two positions, and
   one of the two positions is connected with a gate of the MOS transistor, and the other of the two positions is connected with a source of the MOS transistor.

4. The semiconductor integrated circuit device according to claim 3, wherein the MOS transistor as the detecting circuit operates as a protective circuit as well, and a drain of the MOS transistor is connected with the signal line.

5. The semiconductor integrated circuit device according to claim 3, wherein the MOS transistor as the detecting circuit operates as a protective circuit as well, and a drain of the MOS transistor is connected with a power supply line on a high-potential side of the first power supply system.

6. The semiconductor integrated circuit device according to claim 1, wherein the protective circuit is a thyristor,
   a MOS transistor as the detecting circuit connected with the thyristor is provided,
   a gate of the MOS transistor is connected with one of the two positions, and a source of the MOS transistor is connected with the other of the two positions,
   a drain of the MOS transistor is connected with a base portion of a bipolar transistor composing the thyristor, and
   the MOS transistor operates due to a potential difference between the two positions, and the thyristor starts operation through the operation.

7. The semiconductor integrated circuit device according to claim 6, further comprising a second protective circuit for protecting the detecting circuit.

8. The semiconductor integrated circuit device according to claim 7, wherein the second protective circuit includes a resistor and a diode.

9. The semiconductor integrated circuit device according to claim 1, wherein the two positions are set in the discharge path between the first circuit and the second circuit, and
   the discharge path between the first circuit and the second circuit is set such that the potential difference between the two positions can be detected when the abnormal voltage is generated, and set shorter than a portion where the discharge path in the first power supply system opposes the discharge path in the second power supply system.

10. The semiconductor integrated circuit device according to claim 3, wherein the two positions are set in the discharge path between the first circuit and the second circuit, and
    the discharge path between the first circuit and the second circuit is set such that the potential difference between the two positions can be detected when the abnormal voltage is generated, and set shorter than a portion where the discharge path in the first power supply system opposes the discharge path in the second power supply system.

11. A semiconductor integrated circuit device, comprising:
    a power supply system including a circuit connected with a power supply line;
    a signal line for transmitting a signal between the circuit and an external circuit of the power supply system; and a discharge path which is different from the signal line and through which an abnormal current flows when an abnormal voltage is applied to the power supply system; and a protective circuit that is provided outside the discharge path and operates based on the potential difference between the two positions in the discharge path.

12. The semiconductor integrated circuit device according to claim 11, wherein the protective circuit is connecting with both ends of a discharging unit in the discharge path.

13. The semiconductor integrated circuit device according to claim 11, wherein the protective circuit is a MOS transistor connected with the two positions, and one of the two positions is connected with a gate of the MOS transistor, and the other of the two positions is connected with a source or drain of the MOS transistor.

14. The semiconductor integrated circuit device according to claim 11, wherein the protective circuit is a thyristor, a MOS transistor connected with the thyristor is provided, and a gate of the MOS transistor is connected with one of the two positions, and a source or drain of the MOS transistor is connected with the other of the two positions.

* * * * *